(12) United States Patent
Glenn

(10) Patent No.: US 6,882,064 B2
(45) Date of Patent: Apr. 19, 2005

(54) SYSTEM TO VARY CAPACITANCE BASED ON A CONTROL SIGNAL

(75) Inventor: Robert C. Glenn, Bend, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/601,984

(22) Filed: Jun. 23, 2003

(65) Prior Publication Data

US 2004/0257722 A1 Dec. 23, 2004

(51) Int. Cl.⁷ .................................................. H01G 7/06
(52) U.S. Cl. ..................................................... 307/109
(58) Field of Search ............................ 307/109; 375/327

(56) References Cited

U.S. PATENT DOCUMENTS

| | | | | |
|---|---|---|---|---|
| 4,259,746 A | * | 3/1981 | Sandstedt | 398/115 |
| 4,893,087 A | * | 1/1990 | Davis | 327/106 |
| 4,973,922 A | * | 11/1990 | Embree et al. | 331/108 D |
| 5,600,187 A | * | 2/1997 | El-Hamamsy et al. | 307/157 |
| 6,552,569 B1 | * | 4/2003 | Wert | 326/68 |
| 6,574,288 B1 | * | 6/2003 | Welland et al. | 375/327 |
| 6,621,893 B1 | * | 9/2003 | Elzur | 379/93.05 |
| 6,754,147 B1 | * | 6/2004 | Hsu et al. | 369/47.28 |

* cited by examiner

*Primary Examiner*—Brian Sircus
*Assistant Examiner*—Marc L Shin
(74) *Attorney, Agent, or Firm*—Buckley, Maschoff & Talwalkar LLC

(57) ABSTRACT

Some embodiments provide a plurality of capacitors coupled in parallel, a plurality of capacitor switches, each one of the capacitor switches coupled in series with a respective one of the plurality of capacitors, one or more biasing circuits to independently set each of the plurality of capacitor switches to one of a reset voltage, a first threshold voltage, and a second threshold voltage, and a plurality of control switches, each of the control switches to couple and to decouple a respective one of the plurality of capacitor switches to and from a control voltage.

14 Claims, 6 Drawing Sheets

SYSTEM TO VARY CAPACITANCE BASED ON A CONTROL SIGNAL

BACKGROUND

A circuit may vary the effective capacitance of a circuit element in response to a control signal. According to one example, a voltage-controlled oscillator (VCO) may vary the effective capacitance of an internal element in response to a signal that indicates a desired output frequency of the VCO. The output frequency then changes in response to the changed capacitance. In the case of a VCO, it is often difficult to vary an effective capacitance of the internal element to an extent required to produce a desired range of output frequencies. Some VCOs attempt to address this difficulty by switching in additional or alternative capacitive elements when needed. The additional or alternative capacitive elements may change a "center" frequency of the VCO, and may therefore increase the tuning range thereof.

The foregoing technique may cause a jump in the output frequency of the VCO. Accordingly, additional or alternative capacitive elements are usually coupled selectively to a VCO prior to operation of the VCO. This coupling may be based on a stored control word that indicates a desired center frequency of the VCO. The output frequency of the VCO is then fine-tuned during operation by varying the capacitance of a single circuit element.

DETAILED DESCRIPTION

Figure 1:
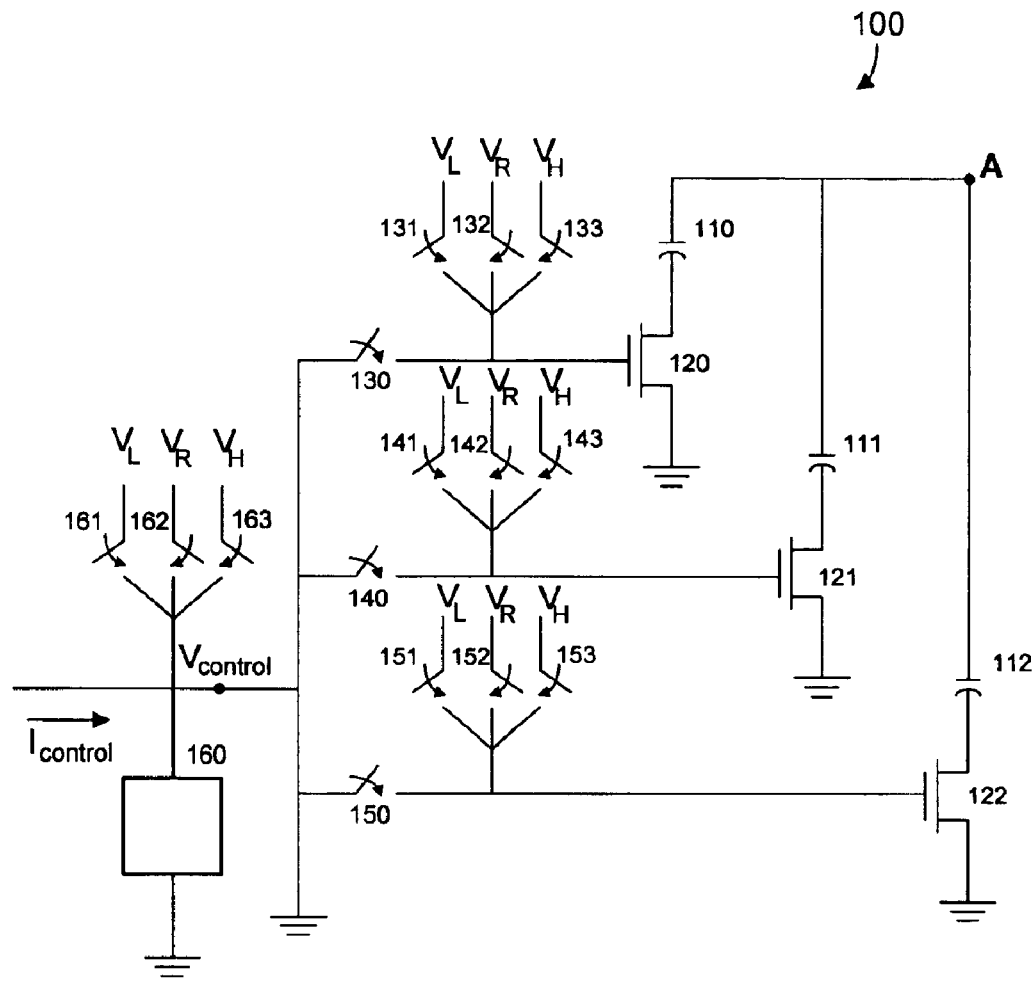
FIG. 1 is a schematic diagram of a circuit according to some embodiments.

FIG. 1 is a schematic diagram of circuit 100 according to some embodiments. Circuit 100 includes capacitors 110, 111 and 112 coupled in parallel. Although capacitors 110, 111 and 112 are illustrated as single capacitors, some embodiments of capacitors 110, 111 and 112 include one or more active and/or passive elements that provide a particular characteristic capacitance. In this regard, capacitors 110, 111 and 112 of FIG. 1 may represent the particular characteristic capacitance of the one or more elements.

Capacitors 110, 111 and 112 are coupled in series to respective ones of capacitor switches 120, 121 and 122. Capacitor switches 120, 121 and 122 each may comprise a complementary metal-oxide semiconductor (CMOS) transistor, however capacitor switches 120, 121 and 122 are not limited thereto. In a case that one of capacitor switches 120, 121 and 122 is completely "closed" (i.e., its gate voltage results in a minimum drain-to-source resistance), current may flow substantially freely from a respective capacitor to ground. The respective capacitor therefore contributes substantially its entire characteristic capacitance to the total capacitance of capacitors 110, 111 and 112.

One of capacitor switches 120, 121 and 122 is "open" if its gate voltage prevents substantially any current from flowing to ground from its respective capacitor. In such a case, the capacitor contributes negligibly to the total capacitance of capacitors 110, 111 and 112. Therefore, as the resistance provided by a capacitor switch decreases, an increased percentage of a respective capacitor's characteristic capacitance is contributed to the total capacitance. In some embodiments, the quality factor ("Q") of the contributed capacitance also increases as the capacitor switch resistance decreases.

The total capacitance may equal the sum at node A of the effective capacitances contributed by each capacitor 110, 111 and 112. The total capacitance may be contributed to another circuit that is coupled to circuit 100 at node A. Node A may be coupled to a VCO in which a frequency of oscillation is based at least in part on the capacitance provided at node A. Accordingly, the frequency of oscillation may be changed by changing the total capacitance provided at node A. In some embodiments, the total capacitance provided at node A may be changed without significantly changing the Q of the VCO.

Capacitor switches 120, 121 and 122 are respectively coupled to control switches 130, 140 and 150. Control switches 130, 140 and 150 may couple and decouple a respective capacitor switch to a control voltage. In some embodiments, the control voltage thereby determines an effective capacitance that an associated capacitor contributes to the total capacitance at node A.

Capacitor switch 120 is coupled to biasing circuits 131, 132 and 133. Biasing circuit 131 may set capacitor switch 120 to a first threshold voltage $V_L$, biasing circuit 132 may set capacitor switch 120 to a reset voltage $V_R$, and biasing circuit 133 may set capacitor switch 120 to a second threshold voltage $V_H$. In the present example, the voltages serve to change a series resistance between capacitor 110 and ground. As described above, a change in the resistance between capacitor 110 and ground changes an amount of the characteristic capacitance of capacitor 110 that is contributed to the total capacitance at node A.

According to some embodiments, the first threshold voltage "opens" capacitor switch 120. The first threshold voltage therefore causes capacitor 110 to contribute negligibly to the total capacitance at node A. The second threshold voltage "closes" capacitor switch 120, resulting in substantially all the characteristic capacitance of capacitor 110 to be contributed to the total capacitance.

The reset voltage may be a voltage that causes capacitor switch 120 to present capacitor 110 with a resistance between 0 and infinity. This resistance may be in the middle of the resistive range of capacitor switch 120. In some embodiments, the first threshold voltage is a voltage at which any further decrease in $V_{control1}$ would not increase a resistance of capacitor switch 120, the second threshold voltage is a voltage at which any further increase in $V_{control1}$ would not decrease a resistance of capacitor switch 120, and the reset voltage is a voltage somewhere between the first and second threshold voltages, such as an average of the first and second voltages.

Biasing circuits 141, 142 and 143 are coupled to capacitor switch 121. In addition, biasing circuits 151, 152 and 153 are coupled to capacitor switch 122. Relationships between these biasing circuits and capacitor switches may be similar to those described with respect to switch 120 and circuits 131 through 133.

Control circuit 160 generates the control voltage ($V_{control}$) that may be coupled and decoupled to capacitor switch 120, 121 and 122 by control switches 130, 140 and 150. Control circuit 160 may be a loop filter of a phase-locked loop (PLL) or any other circuit to generate a control voltage. In the present example, control circuit 160 generates the control voltage based on a control current ($I_{control}$). An embodiment is described below in which the control current is generated by a charge pump.

Control biasing circuits 161, 162 and 163 are coupled to control circuit 160. Biasing circuit 161 may set $V_{control}$ to the first threshold voltage $V_L$, biasing circuit 162 may set $V_{control}$ to the reset voltage $V_R$, and biasing circuit 163 may set $V_{control}$ to the second threshold voltage $V_H$.

Figure 2:
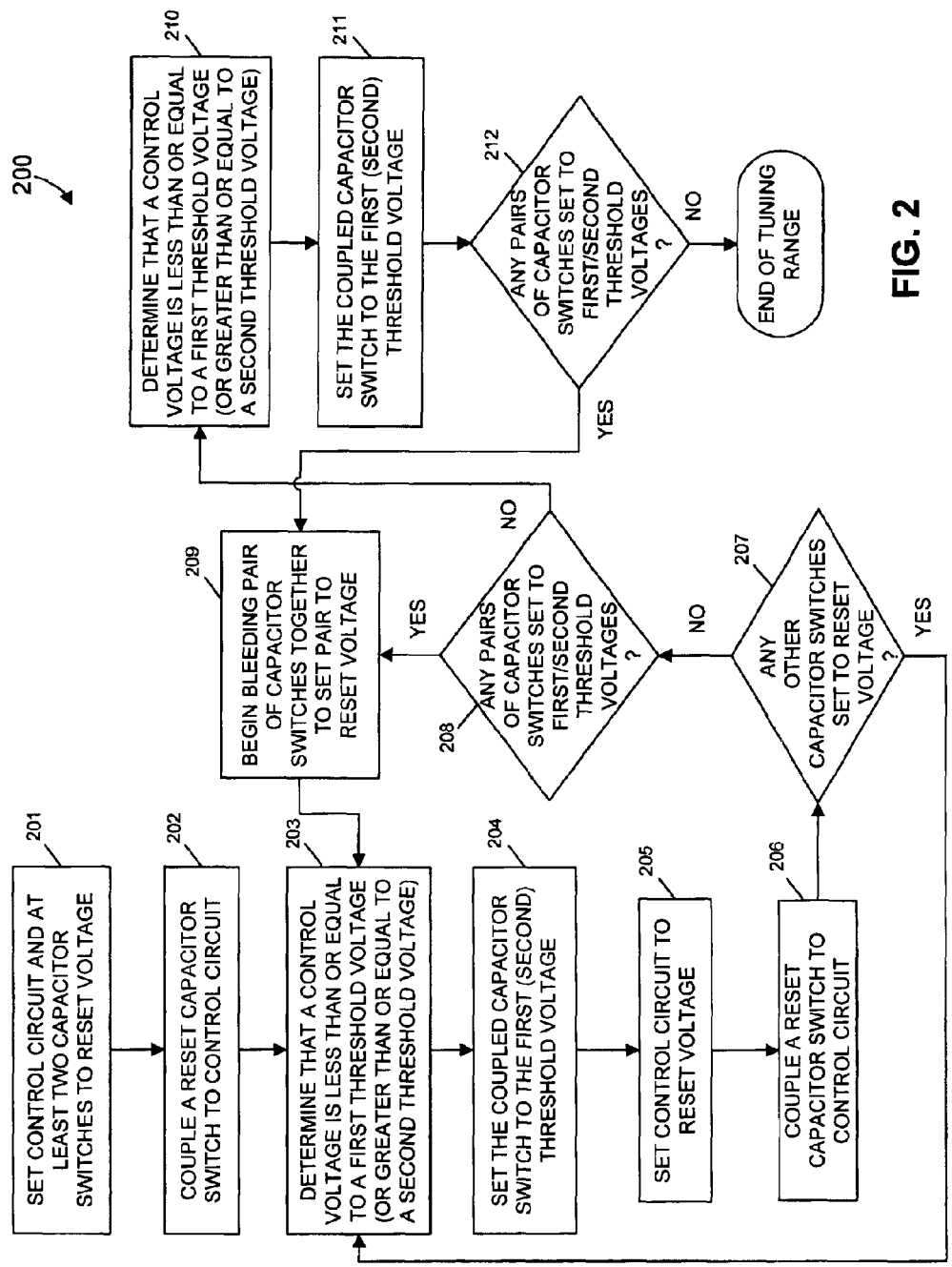
FIG. 2 is a flow diagram of a process according to some embodiments.

FIG. 2 is a flow diagram of process 200 according to some embodiments. Process 200 may change an effective capacitance of circuit 100 at node A in response to a control voltage. Process 200 may be executed by a digital state machine and/or other hardware and software coupled to circuit 100.

At 201, control circuit 160 and at least two of capacitor switches 120, 121 and 122 are set to the reset voltage $V_R$. In the illustrated example, biasing circuits 132 and 142 are respectively coupled to capacitor switches 120 and 121, biasing circuit 151 is coupled to capacitor switch 122, and control biasing circuit 162 is coupled to control circuit 160. The terms "couple" and "decouple" as used herein may refer to the creation and destruction of electrical connections between two elements and/or between an element and a signal. In an alternative example, biasing circuit 132 may always be in electrical communication with capacitor switch 120, but may be selectively activated in order to "couple" biasing circuit to capacitor switch 120 and to therefore apply the reset voltage to switch 120.

In some embodiments, all capacitor switches are set to the reset voltage at 201. The resulting Q of the capacitance that is contributed to node A may be low because the effective series resistance of each capacitor is substantial. Accordingly, in some embodiments, two capacitor switches are set to the reset voltage, half of the remaining capacitor switches are set to the first threshold voltage, and the other half of the remaining capacitor switches are set to the second threshold voltage. The effective capacitance contributed to node A in such embodiments may be substantially identical to that contributed by the previously-described embodiments, but the Q of the contributed capacitance may be significantly greater. In this regard, capacitors associated with capacitor switches that are set to the second threshold voltage contribute high Q capacitances to node A and capacitors associated with capacitor switches that are set to the first threshold voltage contribute very little capacitance and therefore very little to the Q at node A.

One of the capacitor switches set to the reset voltage is coupled to control circuit 160 at 202. Capacitor switch 120 may be coupled to control circuit 160 at 202 by closing control switch 130. Biasing circuit 132 and control biasing circuit 162 are then uncoupled from capacitor switch 120 and control circuit 160 prior to 203. Next, control circuit 160 receives the control current $I_{control}$ and control voltage $V_{control}$ changes based on a response of control circuit 160 to the control current.

Capacitor switch 120 is coupled to the control voltage by virtue of its coupling to control circuit 160. A resistance of capacitor switch 120 may therefore change in response to a change in the control voltage. The change in resistance changes an amount of the characteristic capacitance of capacitor 110 that contributes to the total capacitance of capacitors 110, 111 and 112. Therefore, a change in the control voltage may cause a change in the effective capacitance at node A.

According to one example, the control current causes the control voltage to decrease after 202. This decrease may increase a resistance of capacitor switch 120 and cause capacitor 110 to contribute less and less of its characteristic capacitance to node A. A comparator (not shown) may determine at 203 that the control voltage has decreased below the first threshold voltage $V_L$. Capacitor switch 120 is therefore set to the first threshold voltage $V_L$ by coupling biasing circuit 131 thereto at 204. Capacitor switch 120 may also be decoupled from control circuit 160 (and from the control voltage) at 204 by opening control switch 130.

Alternatively, $V_{control}$ may increase under the influence of $I_{control}$ at 203. In some embodiments, the increase in $V_{control}$ decreases a resistance of capacitor switch 120 and thereby causes capacitor 110 to contribute increasing amounts of its characteristic capacitance to node A. It may eventually be determined at 203 that $V_{control}$ is greater than or equal to the second threshold voltage $V_H$. Capacitor switch 120 is therefore set to the second threshold voltage ($V_H$) at 204 by biasing circuit 133.

Next, control circuit 160 is set to the reset voltage at 205 as described above with respect to 201. A capacitor switch that is set to the reset voltage is coupled to control circuit 160 at 206. At least one capacitor switch will initially be available for coupling to control circuit 160 at 206 because at least two capacitor switches were set to the reset voltage at 201. In the present example, capacitor switch 121 is coupled to control circuit 160 at 206. It is then determined at 207 whether any capacitor switches other than capacitor switch 121 are set to the reset voltage. If so, flow returns to 203. If no other capacitor switches are set to the reset voltage, flow proceeds to 208.

At 208, it is determined whether any pair of capacitor switches exist in which one of the capacitor switches is set to the first threshold voltage and the other capacitor switch is set to the second threshold voltage. If so, the biasing voltages may be bled together at 209 using external circuitry in order to set each of the pair of capacitor switches to the reset voltage. The effective capacitance contributed by the capacitors associated with the pair will be substantially the same before and after 209. Flow returns to 203 from 209 and proceeds as described above.

In a case the determination at 208 is negative, then all capacitor switches other than the switch coupled to the control circuit at 206 are set to one of the first or second threshold voltages. Flow therefore continues through 210 and 211 as described above with respect to 203 and 204. Next, at 212, it is again determined whether any pair of capacitor switches exist in which one of the capacitor switches is set to the first threshold voltage and the other capacitor switch is set to the second threshold voltage.

The determination at 212 is positive if the coupled capacitor switch was set at 211 to a threshold voltage that differs from the threshold voltage to which each other capacitor switch is set. As a result, flow returns to 209 to bleed the coupled capacitor switch together with another capacitor switch.

If the determination at 212 is negative, then all capacitor switches are set to one of the first or second threshold voltages. Circuit 100 has therefore reached the end of its tuning range and process 200 terminates.

According to some embodiments, elements 208 through 212 of process 200 are omitted, and an end of the tuning range is reached if the determination at 207 is negative. In some of these embodiments, 208 and 209 are executed continuously during process 200. For example, circuit 100 is monitored while process 200 executes to determine whether any capacitor switches are coupled to the reset voltage. If none are, then 208 and 209 are executed as described above. The determination at 207 will therefore be positive so long as all of the capacitor switches are not set to one of the first threshold voltage and the second threshold voltage.

Process 200 may be used to vary a capacitance at node A based on the control voltage. Although the above-described embodiment increases the node A capacitance in response to an increasing control voltage, some embodiments decrease the node A capacitance in response to an increasing control voltage.

Figure 3:
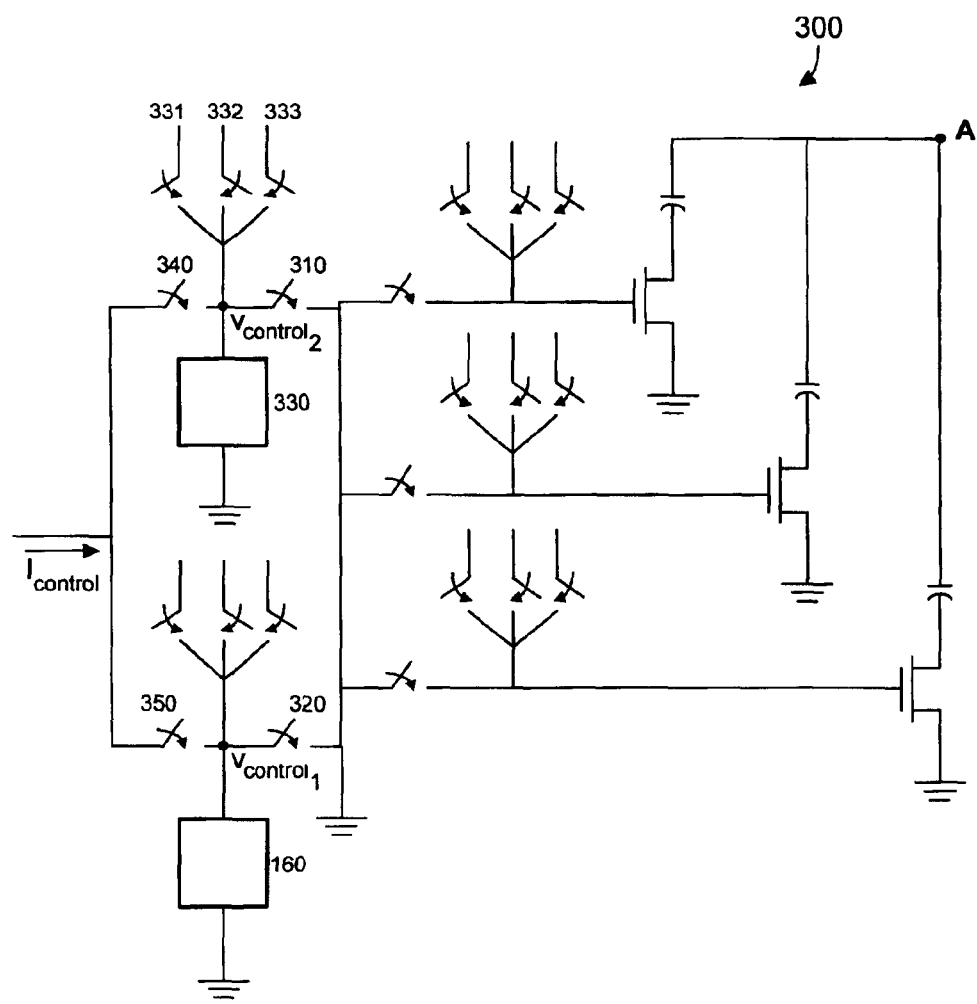
FIG. 3 is a schematic diagram of a circuit according to some embodiments.

FIG. 3 is a schematic diagram of circuit 300 according to some embodiments. Circuit 300 is identical to circuit 100 except for the addition of control switches 310 and 320, control circuit 330, and control biasing circuits 331, 332 and 333. Control circuit 330 and control biasing circuits 331, 332 and 333 may be identical to their respective counterparts 160 through 163. The additional elements may be used at 206 and 208 of process 200.

In some embodiments of process 200 and circuit 100, flow may be delayed at 206 and 208 to allow time for $V_{control}$ to reach the voltage to which control circuit 160 is set. Circuit 300 may reduce this delay by using master control switches 310 and 320 to couple only one of control voltages $V_{control1}$ and $V_{control2}$ to the remainder of circuit 300 at a time. The uncoupled voltage is controlled by its associated control biasing circuits to equal a control voltage that will subsequently be required at 206 or 208.

For example, in a case that one or more of capacitor switches 120 through 122 are set to the reset voltage, an uncoupled one of control circuit 160 and control circuit 430 is set to the reset voltage during 201 through 205. At 206, the master control switch associated with the uncoupled control circuit is closed and the other master control switch is opened.

In a case that none of capacitor switches 120 through 122 are set to the reset voltage, an uncoupled one of control circuit 160 and control circuit 330 is set to the first or second threshold voltage during 201 through 205, depending on the control voltage that will be required in step 208. The, at 208, the master control switch associated with the uncoupled control circuit is closed and the other master control switch is opened.

Figure 4:
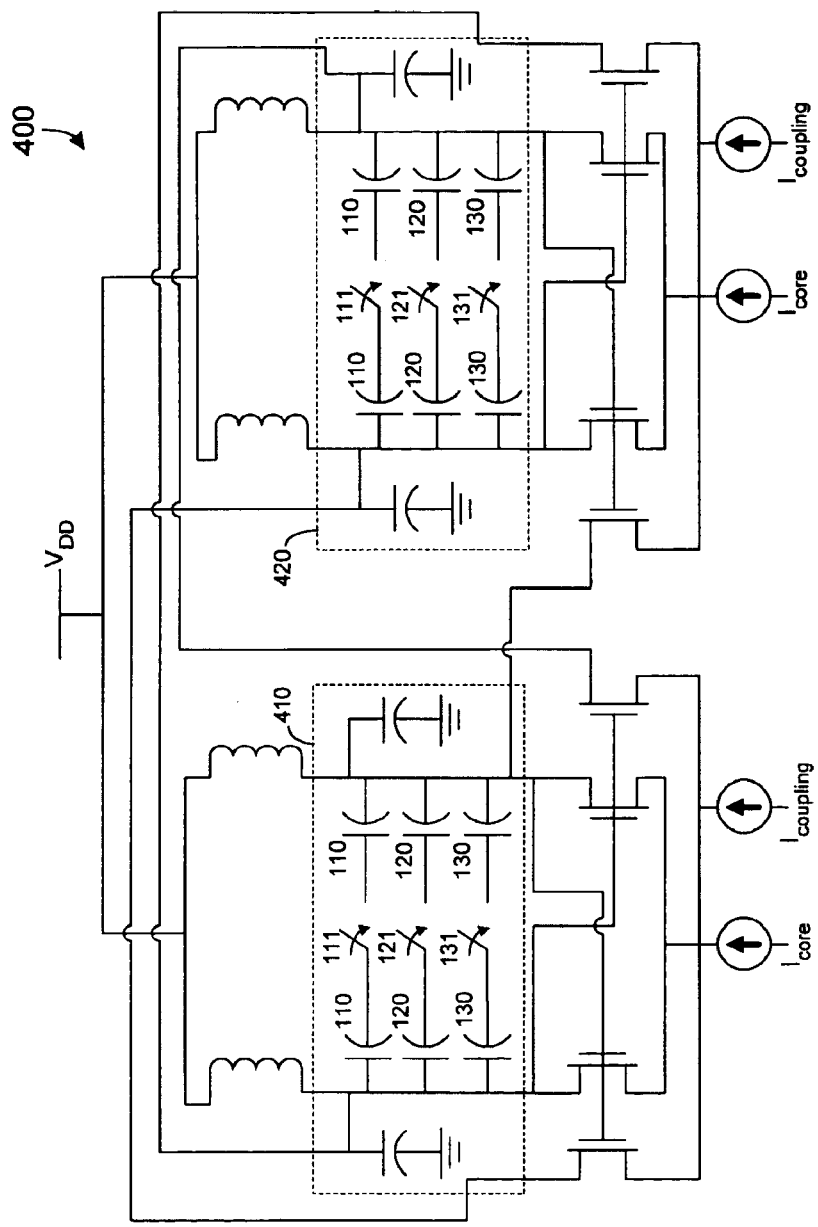
FIG. 4 is a schematic diagram of a VCO according to some embodiments.

FIG. 4 is a schematic diagram of VCO 400 that may be used in conjunction with some embodiments. VCO 400 is a differential-mode LC tank-based VCO known to those of ordinary skill. An output frequency of oscillation of VCO 400 is based at least on output-controlling capacitances 410 and 420. Output-controlling capacitances 410 and 420 include capacitors 110 through 112 and associated capacitor switches 120 through 122. In contrast to the single-ended embodiment of FIG. 1, capacitors 120 through 122 are shown in a differential-mode configuration in FIG. 4. As described with respect to FIGS. 1 and 2, capacitors 110 through 112 of FIG. 4 provide capacitance to VCO 400 based on voltage-controlled series resistances of capacitor switches 120 through 122.

The output frequency of VCO 400 is also based on $I_{core}$ and $I_{coupling}$. $I_{core}$ and $I_{coupling}$ are received from a voltage-to-current converter (not shown) that receives the control voltage from control circuit 160. $I_{core}$ and $I_{coupling}$ are therefore based on the received control voltage. According to some embodiments, the output frequency of VCO 400 is based alternatively or additionally on a capacitive element such as a varactor or variable capacitor that provides a capacitance based on the control voltage.

In the operation of some embodiments, $I_{core}$ and $I_{coupling}$ (and/or a capacitance of the aforementioned capacitive element) are initially fixed by uncoupling control circuit 160 from the voltage-to-current converter (and/or from the capacitive element) and by inputting a suitable voltage to the voltage-to-current converter (and/or to the capacitive element). The signals (and/or capacitance) may be fixed to a midpoint within their operational range. Next, process 200 may be executed until an output frequency of VCO 400 equals a reference value. Capacitor switches 120 through 122 may then be held at their existing voltages while control circuit 160 is coupled to the voltage-to-current converter (and/or to the capacitive element) in order to fine-tune the output frequency.

Figure 5:
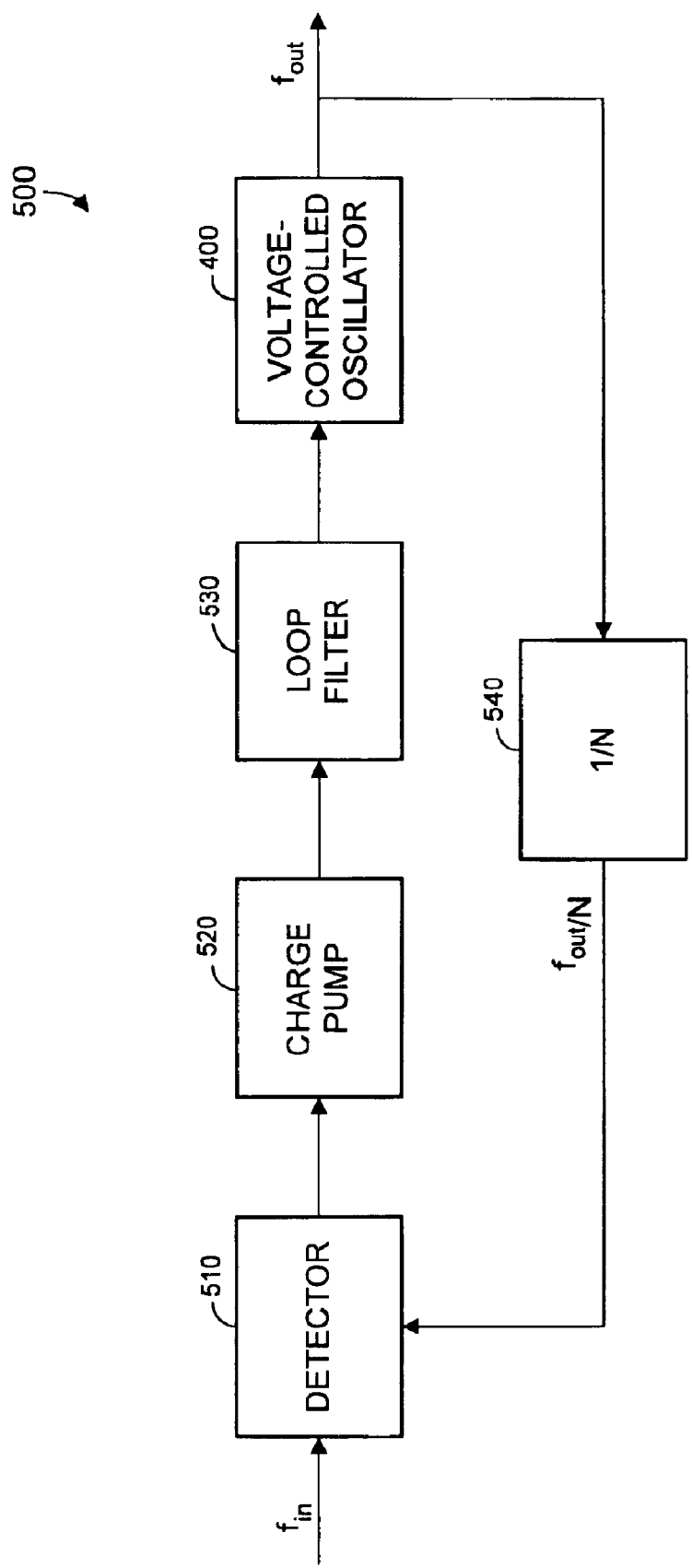
FIG. 5 is a block diagram of a phase-locked loop according to some embodiments.

FIG. 5 is a block diagram of PLL 500 according to some embodiments. PLL 500 includes VCO 400, which in turn includes circuit 100 of FIG. 1. Also included in PLL 500 are detector 510, charge pump 520, loop filter 530, and feedback divider 540. PLL 500 may be used to generate a output signal $f_{out}$ that is equal to $N(f_{in})$.

In operation, input signal $f_{in}$ is received by detector 510. Detector 510 also receives the signal $f_{out}/N$ from feedback divider 540. Detector 510 determines a difference between the frequency or phase of the two received signals and generates a difference signal that indicates the determined difference. Detector 510 transmits the difference signal to charge pump 520, which generates a control signal based on the difference signal. The control signal, which may be represented by $I_{control}$ in FIG. 1, is transmitted to loop filter 530.

Loop filter 530 may embody control circuit 160 of circuit 100. As such, loop filter 530 may generate a control voltage $V_{control}$ based on the control signal received from charge pump 520. The control voltage controls an internal capacitance of VCO 400, which in turn determines a frequency or phase of the output signal $f_{out}$. According to the illustrated embodiment, the internal capacitance includes the capacitance that is contributed by capacitors 121, 122 and 123 in response to the control voltage. Divider 540 divides the frequency or phase of the output signal by N prior to transmitting the divided signal to detector 510.

In some embodiments, charge pump 520 sources current to loop filter 530 if $f_{out}/N$ is greater than $f_{in}$. A control voltage produced by loop filter 530 increases in response to the sourced current, and circuit 100 adds capacitance to the output-controlling capacitance of VCO 400 in response to the increased control voltage. This additional capacitance reduces the frequency or phase of $f_{out}$, and thereby also reduces the frequency or phase of $f_{out}/N$ Charge pump 520 may sink current from loop filter 530 if $f_{out}/N$ is less than $f_{in}$, resulting in an increase in the frequency or phase of $f_{out}/N$. These processes eventually result in $f_{out}/N=f_{in}$, or $f_{out}=N(f_{in})$.

Figure 6:
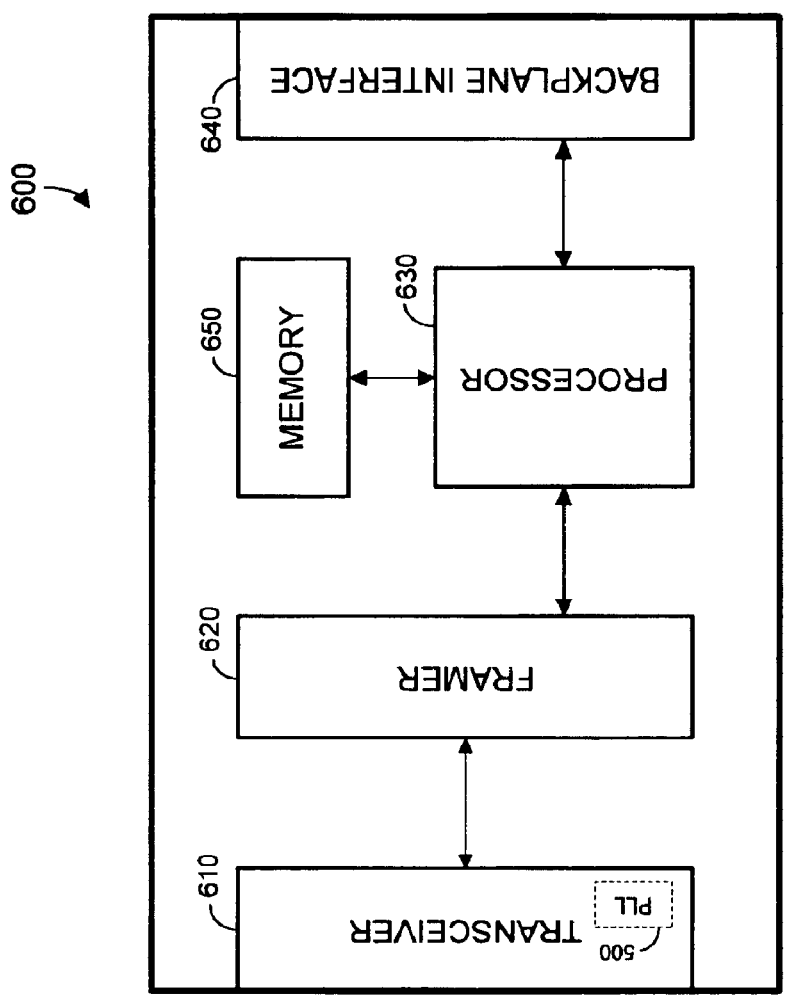
FIG. 6 is a block diagram of a line card according to some embodiments.

FIG. 6 is a block diagram of line card 600 according to some embodiments. Line card 600 may provide an interface between a main backplane and an optical network. Line card 600 may comprise a circuit board onto which the illustrated elements are mounted. The elements include transceiver 610, framer 620, processor 630, backplane interface 640, and memory 650.

Transceiver 610 may be an optical transceiver including elements for transmitting and receiving data over an optical physical layer. A transmitting section of transceiver 610 may comprise PLL 500 including VCO 400 and circuit 100. A receiving section may include a Clock and Data Recovery Unit that also incorporates VCO 400 and circuit 100. Transceiver 610 may also comprise a serial/deserializer to process outgoing/incoming data.

Framer 620 may receive and decapsulate encapsulated data that is received by the receiving section of transceiver 610. Framer 620 may also encapsulate data received from processor 630 prior to transmitting the encapsulated to transceiver 620. Processor 630 receives/transmits data from/to backplane interface 640, which communicates with a network server or a network switch backplane. Memory 650 is in communication with processor 630 and may comprise a Double Data rate Random Access Memory, a Quad Data rate Random Access Memory, or any other suitable memory. Memory 650 may store code executable by processor 630 and/or other data for use by processor 630.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

For example, some embodiments may be used in conjunction with any suitable VCO. The output-controlling capacitances of such VCOs may be configured within an RC ring oscillator, an LC tank, an RC tank, or any other type of circuit. Some embodiments provide capacitances that may be switched in and out of a circuit gradually so as to minimize their effect on circuit behavior and circuit Q.

What is claimed is:

1. A circuit comprising:
   a plurality of capacitors coupled in parallel;
   a plurality of capacitor switches, each one of the capacitor switches coupled in series with a respective one of the plurality of capacitors;
   one or more biasing circuits to independently set each of the plurality of capacitor switches to one of a reset voltage, a first threshold voltage, and a second threshold voltage;
   a plurality of control switches, each of the control switches to couple and to decouple a respective one of the plurality of capacitor switches to and from a control voltage; and
   one or more control biasing circuits to set the control voltage to one of the reset voltage, the first threshold voltage, and the second threshold voltage.

2. A circuit according to claim 1, further comprising an oscillating circuit coupled to the plurality of capacitors by the plurality of capacitor switches, a frequency of oscillation of the oscillating circuit based at least on a capacitance provided to the oscillating circuit by the plurality of capacitors.

3. A circuit according to claim 1, further comprising:
   a control circuit, the control circuit to generate the control voltage.

4. A circuit according to claim 3, further comprising:
   a charge pump, the charge pump to sink or source a control current to or from the control circuit, the control circuit to generate the control voltage based at least in part on the control current.

5. A circuit according to claim 4, further comprising:
   a detector, the detector to transmit a difference signal to the charge pump, the difference signal indicating a difference between a reference signal and an output signal, wherein the output signal is based on one or more of the plurality of capacitors, and wherein the charge pump is to generate the control current based on the difference signal.

6. A circuit according to claim 5, further comprising:
   an oscillating circuit coupled to the plurality of capacitors by the plurality of capacitor switches, the oscillating circuit to output the output signal, wherein the output signal is based at least on a capacitance provided to the oscillating circuit by the plurality of capacitors.

7. A circuit according to claim 1, wherein if a particular capacitor switch is set to the first threshold voltage, a particular capacitor coupled in series with the particular capacitor switch contributes negligibly to a total capacitance of the plurality of capacitors,
   wherein if the particular capacitor switch is set to the second threshold voltage, the particular capacitor coupled in series with the particular capacitor switch contributes substantially its characteristic capacitance to the total capacitance of the plurality of capacitors, and
   wherein the reset voltage is greater than the first threshold voltage and less than the second threshold voltage.

8. A method comprising:
   setting a control circuit and a plurality of capacitor switches to a reset voltage, a first one of the capacitor switches coupled in series to a first capacitor of a plurality of capacitors;
   coupling the first capacitor switch to the control circuit;
   determining that a control voltage of the control circuit is less than a first threshold voltage, wherein the first threshold voltage is less than the reset voltage;
   setting the first capacitor switch to the first threshold voltage;
   uncoupling the first capacitor switch from the control circuit; and
   setting the control circuit to the reset voltage.

9. A method according to claim 8, wherein the first capacitor contributes negligibly to a total capacitance of the plurality of capacitors if the first capacitor switch is set to the first threshold voltage.

10. A method according to claim 9, wherein setting the first capacitor switch to the first threshold voltage opens the first capacitor switch.

11. A method according to claim 8, further comprising:
    coupling a second capacitor switch of the plurality of capacitor switches to the control circuit, the second capacitor switch coupled in series to a second capacitor;
    determining that a control voltage of the control circuit is greater than a second threshold voltage, wherein the second threshold voltage is greater than the reset voltage;
    setting the second capacitor switch to the second threshold voltage;
    uncoupling the second capacitor switch from the control circuit; and
    setting the control circuit to the reset voltage.

12. A method according to claim 11, wherein setting the second capacitor switch to the second threshold voltage closes the second capacitor switch.

13. A system comprising:
    a transceiver to transmit and receive data comprising a voltage-controlled oscillator, the voltage-controlled oscillator comprising:

a plurality of capacitors coupled in parallel;

a plurality of capacitor switches, each one of the capacitor switches coupled in series with a respective one of the plurality of capacitors;

one or more biasing circuits to independently set each of the plurality of capacitor switches to one of a reset voltage, a first threshold voltage, and a second threshold voltage;

a plurality of control switches, each of the control switches to couple and to decouple a respective one of the plurality of capacitor switches to and from a control voltage; and one or more control biasing circuits to set the control voltage to one of the reset voltage, the first threshold voltage, and the second threshold voltage;

a processor to process the data; and a double data rate memory in communication with the processor.

14. A system according to claim 13, further comprising:

a framer coupled to the transceiver and to the processor, the framer to decapsulate data received by the transceiver and to encapsulate data to be transmitted by the transceiver.

* * * * *